United States Patent
Tsai

(10) Patent No.: US 10,236,851 B2
(45) Date of Patent: Mar. 19, 2019

(54) WIDE BANDWIDTH VARIABLE GAIN AMPLIFIER AND EXPONENTIAL FUNCTION GENERATOR

(71) Applicant: MEDIATEK INC., Hsin-Chu (TW)

(72) Inventor: Hung-Chieh Tsai, Kaohsiung (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/717,966

(22) Filed: Sep. 28, 2017

(65) Prior Publication Data

US 2018/0138883 A1    May 17, 2018

Related U.S. Application Data

(60) Provisional application No. 62/423,224, filed on Nov. 17, 2016.

(51) Int. Cl.
*H03F 3/45*    (2006.01)
*H03G 9/00*    (2006.01)
(Continued)

(52) U.S. Cl.
CPC ............. *H03G 9/005* (2013.01); *H03F 1/42* (2013.01); *H03F 3/193* (2013.01);
(Continued)

(58) Field of Classification Search
CPC ...... H03G 9/005; H03G 3/001; H03G 1/0023; H03G 1/0029; H03G 1/0035;
(Continued)

(56) References Cited

U.S. PATENT DOCUMENTS 6,630,861 B2   10/2003 Kawaoka
6,791,413 B2 *  9/2004 Komurasaki ....... H03F 3/45183
                                                      330/253
(Continued)

FOREIGN PATENT DOCUMENTS

TW    200625797       7/2006
TW    201004137 A1    1/2010

OTHER PUBLICATIONS

Fu, "A CMOS Linear-in-dB High-Linearity Variable-Gain Amplifier for UWB Receivers", IEEE Asian Solid-State Circuits Conference Nov. 12-14, 2007.

(Continued)

*Primary Examiner* — Khanh V Nguyen
(74) *Attorney, Agent, or Firm* — Winston Hsu

(57) ABSTRACT

A variable gain amplifier includes an input transistor, an auxiliary transistor, an active inductor and an input current replica circuit. The input transistor is arranged for receiving an input signal to generate an output signal at an output terminal. The auxiliary transistor is coupled to the output terminal of the input transistor, wherein a current of the output terminal flows into the input transistor and the auxiliary transistor. The active inductor is coupled to the output terminal of the input transistor. The input current replica circuit is coupled to the output terminal of the input transistor, wherein a current flowing through a portion of the input current replica circuit is equal to the current flowing through the input transistor, and both a current of the active inductor and the current of the portion of the input current replica circuit flow into the output terminal of the input transistor.

18 Claims, 2 Drawing Sheets

(51) Int. Cl.
*H03F 1/42* (2006.01)
*H03F 3/193* (2006.01)
*H03G 1/00* (2006.01)
*H03G 3/00* (2006.01)

(52) U.S. Cl.
CPC ..... *H03F 3/45183* (2013.01); *H03F 3/45219* (2013.01); *H03F 3/45632* (2013.01); *H03G 1/0029* (2013.01); *H03G 3/001* (2013.01); H03F 3/45 (2013.01); H03F 2200/18 (2013.01); H03F 2200/303 (2013.01); H03F 2200/451 (2013.01); H03F 2200/456 (2013.01); H03F 2203/45208 (2013.01); H03G 1/0023 (2013.01); H03G 1/0088 (2013.01)

(58) Field of Classification Search
CPC .... H03G 1/0088; H03G 3/00; H03G 2201/10; H03F 1/42; H03F 3/193; H03F 3/45183; H03F 3/45219; H03F 3/45632; H03F 3/45
USPC .................................................. 330/254, 257
See application file for complete search history.

(56) References Cited

U.S. PATENT DOCUMENTS

| | | | | |
|---|---|---|---|---|
| 6,867,650 | B2* | 3/2005 | Kimura | H03F 1/3211 330/133 |
| 7,557,657 | B2* | 7/2009 | Quoc | H03F 3/45188 330/254 |
| 8,823,452 | B2* | 9/2014 | Chen | H03F 1/3211 330/254 |
| 2007/0096818 | A1* | 5/2007 | Lu | H03F 3/45183 330/254 |
| 2008/0018401 | A1 | 1/2008 | Duong Quoc | |
| 2008/0042748 | A1* | 2/2008 | Kim | H03G 1/0029 330/254 |
| 2009/0072905 | A1* | 3/2009 | Duong Quoc | H03G 1/0029 330/254 |

OTHER PUBLICATIONS

Wu, "A 65nm CMOS 0.1-2.1GHz Linear-in-dB VGA with Active-Inductor Bandwidth Extension for the Square Kilometer Array", 2014 IEEE.

Liu, "Cell-Based Variable-Gain Amplifiers With Accurate dB-Linear Characteristic in 0.18 um CMOS Technology", IEEE Journal of Solid-State Circuits, vol. 50, No. 2, Feb. 2015.

* cited by examiner

WIDE BANDWIDTH VARIABLE GAIN AMPLIFIER AND EXPONENTIAL FUNCTION GENERATOR

CROSS REFERENCE TO RELATED APPLICATIONS

This application claims the priority of U.S. Provisional Application No. 62/423,224, filed on Nov. 17, 2016, which is included herein by reference in its entirety.

BACKGROUND

A variable gain amplifier is an amplifier stage whose gain can be adjusted using information provided by a feedback loop. There are three basic types of variable gain amplifiers that are applicable in automatic gain control: linear, exponential and polynomial. The exponential type, which is also called a linear-in-dB variable gain amplifier, is widely used because of its wide dynamic gain range. To have a wider gain range, the exponential function having an input value "2x" (i.e. exp(2x)) is preferred to be used, however, the bandwidth is always limited to be lower than 1 GHz due to the difficulty of realization, and it's not suitable for high speed serializer/deserializer (serdes) system.

SUMMARY

It is therefore an objective of the present invention to provide a linear-in-dB variable gain amplifier having wide gain range and high bandwidth, to solve the above-mentioned problem.

According to one embodiment of the present invention, a variable gain amplifier comprises a first input transistor, a first auxiliary transistor, a first active inductor and an input current replica circuit. The first input transistor is arranged for receiving a first input signal to generate a first output signal at an output terminal. The first auxiliary transistor is coupled to the output terminal of the first input transistor, wherein a current of the output terminal of the first input transistor flows into the first input transistor and the first auxiliary transistor. The first active inductor is coupled to the output terminal of the first input transistor. The input current replica circuit is coupled to the output terminal of the first input transistor, wherein a current flowing through a portion of the input current replica circuit is equal to the current flowing through the first input transistor, and both a current of the first active inductor and the current of the portion of the input current replica circuit flow into the output terminal of the first input transistor.

According to another embodiment of the present invention, an exponential function generator comprises a first input transistor, a first auxiliary transistor, a first active inductor and an input current replica circuit. The first input transistor is arranged for receiving a first input signal to generate a first output signal at an output terminal. The first auxiliary transistor is coupled to the output terminal of the first input transistor, wherein a current of the output terminal of the first input transistor flows into the first input transistor and the first auxiliary transistor. The first active inductor is coupled to the output terminal of the first input transistor. The input current replica circuit is coupled to the output terminal of the first input transistor, wherein a current flowing through a portion of the input current replica circuit is equal to the current flowing through the first input transistor, and both a current of the first active inductor and the current of the portion of the input current replica circuit flow into the output terminal of the first input transistor.

In one embodiment, the variable gain amplifier can be regarded as an active inductor based exponential function "exp(2x)" generator having the wider dynamic control range. In addition, by using the active inductor, the wide bandwidth can be achieved, without increasing much chip area.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
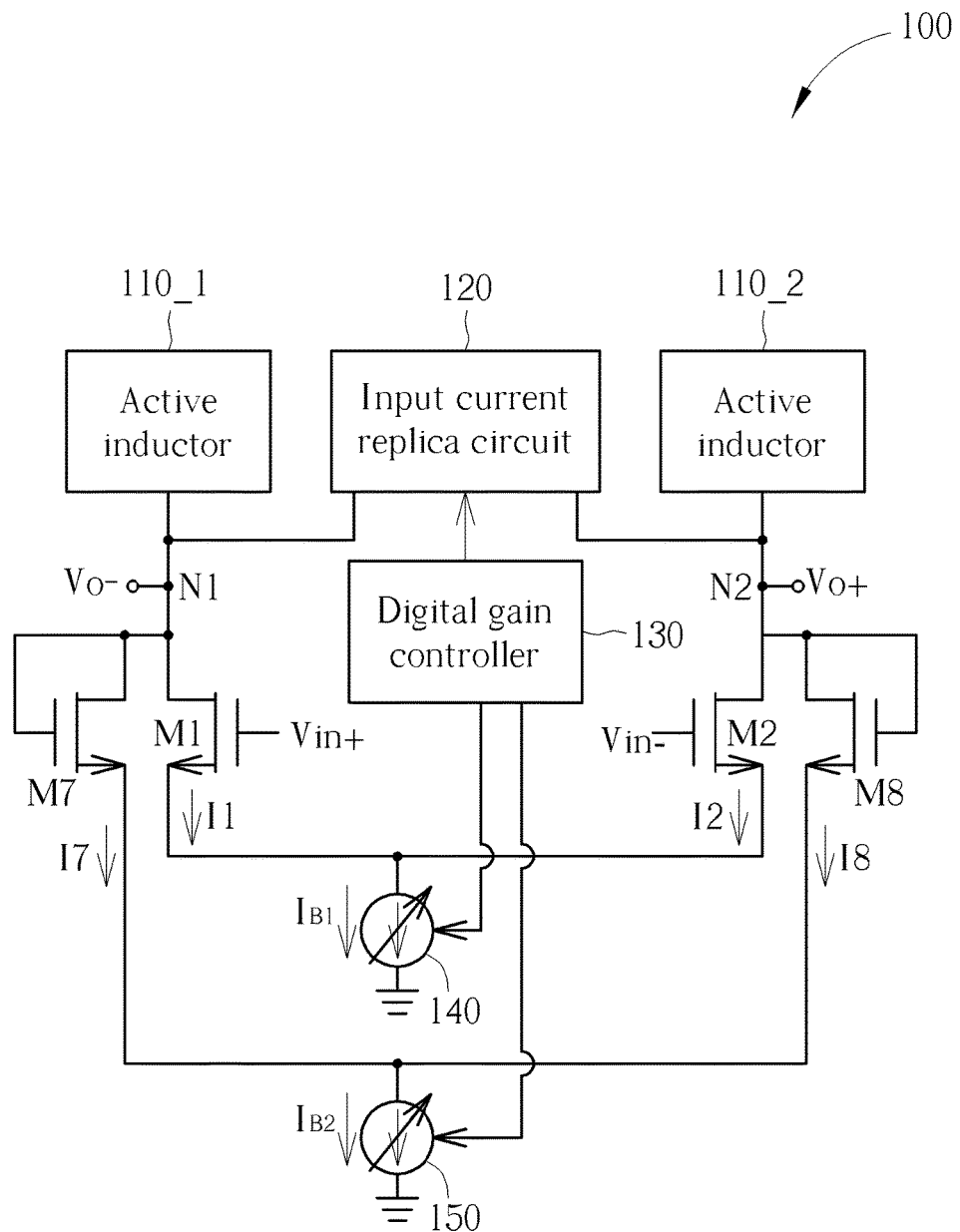
FIG. 1 is a diagram illustrating a variable gain amplifier according to one embodiment of the present invention.

FIG. 1 is a diagram illustrating a variable gain amplifier 100 according to one embodiment of the present invention. As shown in FIG. 1, the variable gain amplifier 100 comprises two input N-type metal-oxide semiconductor (NMOS) M1 and M2, two auxiliary NMOSs M7 and M8, two active inductors 110_1 and 110_2, an input current replica circuit 120, a digital gain controller 130, and two current sources 140 and 150. In this embodiment, the input NMOSs M1 and M2 are used to receive input signals Vin+ and Vin− to generate output signals Vo− and Vo+ at output terminals N1 and N2, respectively. A gate electrode and a drain electrode of the auxiliary NMOS M7 are coupled to a drain electrode (i.e., output terminal N1) of the input NMOS M1, and a gate electrode and a drain electrode of the auxiliary NMOS M8 are coupled to a drain electrode (i.e., output terminal N2) of the input NMOS M2. The active inductor 110_1 is coupled to the drain electrode of the input NMOS M1, the active inductor 110_2 is coupled to the drain electrode of the input NMOS M2, and the input current replica circuit 120 is coupled to the drain electrodes of the input NMOSs M1 and M2. Source electrodes of the input NMOSs M1 and M2 are connected to the current source 140, and a summation of currents of the input NMOSs M1 and M2 (i.e., I1+I2) is equal to a current IB1 provided by the current source 140; and source electrodes of the auxiliary NMOSs M7 and M8 are coupled to the current source 150, and a summation of currents of the auxiliary NMOSs M7 and M8 (i.e., I7+I8) is equal to a current IB2 provided by the current source 150. In addition, the digital gain controller 130 controls the currents of the input current replica circuit 120 and the current sources 140 and 150 to determine a gain of the variable gain amplifier 100.

In the embodiment shown in FIG. 1, the active inductors 110_1 and 110_2 are used to boost the bandwidth, without increasing too much chip area. The input current replica circuit 120 is used to generate wide tuning gain range. The currents IB1 and IB2 provided by the current sources 140 and 150 are controlled to realize the linear-in-dB control, especially an exponential function "exp(2x)". In one embodiment, the input current replica circuit 120 is used to generate the current that is equal to the DC current of the input NMOSs M1 and M2 (i.e. I1 or I2), and the current of the active inductor 110_1 will be equal to the current I7 of the auxiliary NMOS M7, and the current of the active inductor 110_2 will be equal to the current I8 of the auxiliary NMOS M8. In addition, the currents IB1 and IB2 are controlled to have different values. By using the aforementioned setting, the variable gain amplifier 100 can be regarded as the exponential function "exp(2x)", which may have the wider dynamic control range and wide bandwidth.

Figure 2:
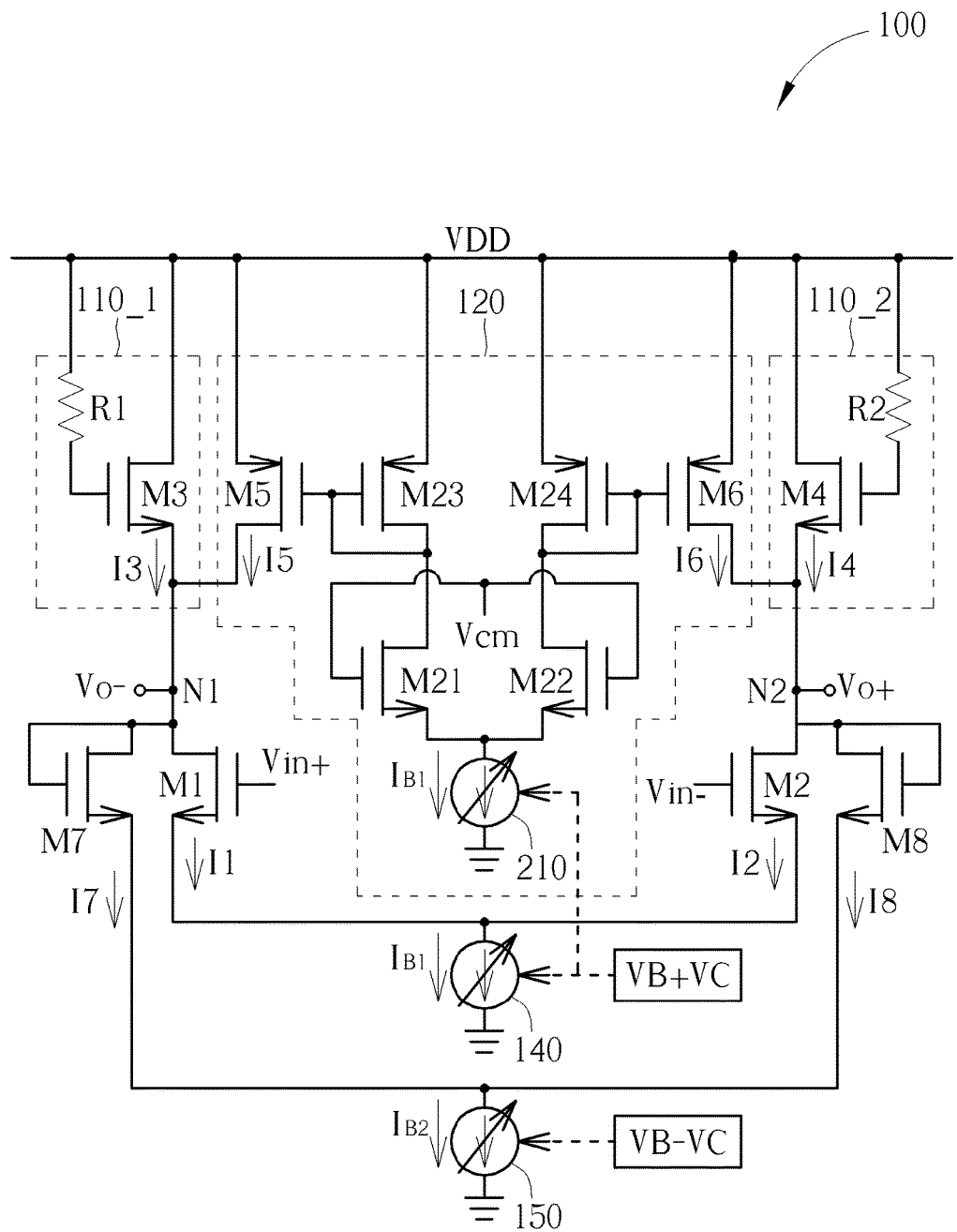
FIG. 2 is a detailed circuit structure of the variable gain amplifier according to one embodiment of the present invention.

FIG. 2 is a detailed circuit structure of the variable gain amplifier 100 according to one embodiment of the present invention. In FIG. 2, the active inductor 110_1 comprises an NMOS M3 and a resistor R1, wherein a gate electrode of the NMOS M3 is coupled to a supply voltage VDD via the resistor R1, and a source electrode of the NMOS M3 is coupled to the drain electrode of the input NMOS M1. The active inductor 110_2 comprises an NMOS M4 and a resistor R2, wherein a gate electrode of the NMOS M4 is coupled to the supply voltage VDD via the resistor R2, and a source electrode of the NMOS M4 is coupled to the drain electrode of the input NMOS M2. The input current replica circuit 120 comprises a current source 210, NMOSs M21 and M22, and P-type metal-oxide semiconductor (PMOS) M5, M6, M23 and M24, where gate electrodes of the NMOSs M21 and M22 are controlled by a voltage Vcm that is a common voltage of the input NMOSs M1 and M2. In this embodiment, each of the current sources 140, 150 and 210 can be implemented by an NMOS, and the gate electrode of the current sources 140 and 210 are both controlled by a control voltage (VB+VC), and the gate electrode of the current source 150 is controlled by a control voltage (VB−VC).

Taking the input NMOS M1, the auxiliary NMOS M7 and the active inductor 110_1 as an example, the gain of the variable gain amplifier 100 can be represented as:

$$gm1 * \frac{\frac{1}{gm7*gm3}}{\frac{1}{gm7}+\frac{1}{gm3}} = \frac{gm1}{gm3+gm7} = \frac{\sqrt{K\left(\frac{W1}{L1}\right)2I1}}{\sqrt{K\left(\frac{W3}{L3}\right)2I3}+\sqrt{K\left(\frac{W7}{L7}\right)2I7}},$$

where "gm1" is a transconductance of the input NMOS M1, "gm3" is a transconductance of the NMOS M3, "gm7" is a transconductance of the auxiliary NMOS M7, "K" is constant factor, "(W1/L1)" is a size (i.e. the ratio of the channel width and channel length) of the input NMOS M1, "(W3/L3)" is a size of the NMOS M3, and "(W7/L7)" is a size of the auxiliary NMOS M7. Because a denominator of the above fraction has two roots, the gain of the variable gain amplifier 100 becomes difficult to control. Therefore, this embodiment provides a setting to make the gain be represented as:

$$\frac{1+x}{1-x},$$

which is an approximation of the exponential function exp(2x).

In detail, in this embodiment, both the current I3 of the NMOS M3 and the current I5 of the PMOS M5 flow into the output terminal N1, and the current of the output terminal N1 flows into the input NMOS M1 and the auxiliary NMOS M7, that is (I3+I5) is equal to (I1+I7). Therefore, by controlling the current I5 equal to the current I1 (both the current sources 140 and 210 are controlled by the same control voltage (VB+VC)), the current I3 will be equal to the current I7. Therefore, the gain of the variable gain amplifier 100 is proportional to:

$$\frac{\sqrt{\left(\frac{W1}{L1}\right)} * \sqrt{I_{B1}}}{2\sqrt{\left(\frac{W3}{L3}\right)} * \sqrt{I_{B2}}}.$$

In addition, if the channel length of the input NMOS M1 and the channel length of the NMOS M3 are the same, the gain can be further represented as:

$$\frac{1}{2} * \sqrt{\frac{W1}{W3}} * \frac{VB+VC-Vt}{VB-VC-Vt},$$

where "Vt" is a threshold voltage of the NMOS. In addition, the above equation can be represented as:

$$\frac{1}{2} * \sqrt{\frac{W1}{W3}} * \frac{1+x}{1-x}, \text{ where } x = \frac{VC}{VB-Vt}.$$

Therefore, because the terms "VB" and "VC" can be controlled by the digital gain controller 130, and the threshold voltage "Vt" is known, the variable gain amplifier 100 can indeed serve as a linear-in-dB variable gain amplifier having exponential function exp(2x).

Regarding the input NMOS M2, the auxiliary NMOS M8 and the active inductor 110_2, both the current I4 of the NMOS M4 and the current I6 of the PMOS M6 flow into the output terminal N2, and the current of the output terminal N2 flows into the input NMOS M2 and the auxiliary NMOS M8, that is (I4+I6) is equal to (I2+I8). Similarly, the current I6 is controlled to be equal to the current I2, to make the current I4 equal to the current I8.

It is noted that the implementations of the active inductors 110_1 and 110_2 and the input current replica circuit 120 are for illustrative purposes only, and they are not a limitation of the present invention. In other embodiment, the active inductors 110_1 and 110_2 can be implemented by any other type of active inductor such as CMOS active inductors, and the input current replica circuit 120 can use other circuit structures to generate the currents I5 and I6 that are equal to the currents I1 and I2. These alternative designs shall fall within the scope of the present invention.

In one embodiment, the variable gain amplifier 100 shown in FIG. 1 or FIG. 2 may be a cell/stage of an amplifying circuit. By using the variable gain amplifier 100, the amplifying circuit may only use less cells to achieve a desired gain range with wide bandwidth. For example, when the amplifying circuit comprises the variable gain amplifiers, the gain range is greater than 60 dB and the bandwidth is greater than 4.5 GHz in a simulation result. Without the present invention, the gain stage number is increased and thereby the bandwidth is limited because large number of gain stage is used.

Briefly summarized, in the variable gain amplifier of the present invention, the variable gain amplifier can serve as a linear-in-dB variable gain amplifier having exponential function exp (2x), that is the variable gain amplifier has a wide dynamic control range. In addition, the active inductors are used to improve the bandwidth. Therefore, the wide gain range and wide bandwidth can be achieved at the same time.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A variable gain amplifier, comprising:
a first input transistor, for receiving a first input signal to generate a first output signal at an output terminal;
a first auxiliary transistor, coupled to the output terminal of the first input transistor, wherein a current of the output terminal of the first input transistor flows into the first input transistor and the first auxiliary transistor;
a first active inductor, coupled to the output terminal of the first input transistor; and
an input current replica circuit, coupled to the output terminal of the first input transistor, wherein a current flowing through a portion of the input current replica circuit is equal to the current flowing through the first input transistor, and both a current of the first active inductor and the current of the portion of the input current replica circuit flow into the output terminal of the first input transistor;
wherein the first input transistor is supplied by a first current source, the first auxiliary transistor is supplied by a second current source, and the variable gain amplifier further comprises:
a gain controller, for determining a gain of the variable gain amplifier by controlling a first current provided by the first current source and a second current provided by the second current source.

2. The variable gain amplifier of claim 1, wherein the current of the first active inductor is equal to the current of the first auxiliary transistor.

3. The variable gain amplifier of claim 1, wherein the input current replica circuit is supplied by another current source whose current is equal to the first current provided by the first current source.

4. The variable gain amplifier of claim 1, wherein the first current is different from the second current.

5. The variable gain amplifier of claim 4, wherein first current source is controlled by a first control voltage (VB+VC), the second current source is controlled by a second control voltage (VB−VC), and the gain of the variable gain amplifier is proportional to a function formed by the values VB and VC.

6. The variable gain amplifier of claim 5, wherein the gain of the variable gain amplifier is proportional to (1+x)/(1−x), x is equal to (VC/VB−Vt), and Vt is a threshold voltage of transistors within the variable gain amplifier.

7. The variable gain amplifier of claim 6, wherein the variable gain amplifier is an exponential function generator with an input value (2*x).

8. The variable gain amplifier of claim 1, further comprising:
a second input transistor, for receiving a second input signal to generate a second output signal at an output terminal, wherein the first input signal and the second input signal is a differential pair;
a second auxiliary transistor, coupled to the output terminal of the second input transistor, wherein a current of the output terminal of the second input transistor flows into the second input transistor and the second auxiliary transistor;
a second active inductor, coupled to the output terminal of the second input transistor; and
wherein the current flowing through another portion of the input current replica circuit is equal to the current flowing through the second input transistor, and both a current of the second active inductor and the current of the other portion of the input current replica circuit flow into the output terminal of the second input transistor.

9. The variable gain amplifier of claim 8, wherein the current of the second active inductor is equal to the current of the second auxiliary transistor.

10. The variable gain amplifier of claim 8, wherein the first input transistor and the second input transistor are supplied by the first current source, the first auxiliary transistor and the second auxiliary transistor are supplied by the second current source.

11. An exponential function generator, comprising:
a first input transistor, for receiving a first input signal to generate a first output signal at an output terminal;
a first auxiliary transistor, coupled to the output terminal of the first input transistor, wherein a current of the output terminal of the first input transistor flows into the first input transistor and the first auxiliary transistor;
a first active inductor, coupled to the output terminal of the first input transistor; and
an input current replica circuit, coupled to the output terminal of the first input transistor, wherein a current flowing through a portion of the input current replica circuit is equal to the current flowing through the first input transistor, and both a current of the first active inductor and the current of the portion of the input current replica circuit flow into the output terminal of the first input transistor;
wherein the first input transistor is supplied by a first current source, the first auxiliary transistor is supplied by a second current source, and the variable gain amplifier further comprises:
a gain controller, for determining a gain of the variable gain amplifier by controlling a first current provided by the first current source and a second current provided by the second current source.

12. The exponential function generator of claim 11, wherein the current of the first active inductor is equal to the current of the first auxiliary transistor.

13. The exponential function generator of claim 11, wherein the input current replica circuit is supplied by another current source whose current is equal to the first current provided by the first current source.

14. The exponential function generator of claim 11, wherein the first current is different from the second current.

15. The exponential function generator of claim 14, wherein first current source is controlled by a first control voltage (VB+VC), the second current source is controlled by a second control voltage (VB−VC), and the gain of the variable gain amplifier is proportional to a function formed by the values VB and VC.

16. The exponential function generator of claim 15, wherein the gain of the variable gain amplifier is proportional to (1+x)/(1−x), x is equal to (VC/VB−Vt), and Vt is a threshold voltage of transistors within the variable gain amplifier.

17. The exponential function generator of claim 16, wherein the variable gain amplifier is an exponential function generator with an input value (2*x).

18. The exponential function generator of claim 11, further comprising:
    a second input transistor, for receiving a second input signal to generate a second output signal at an output terminal, wherein the first input signal and the second input signal is a differential pair;
    a second auxiliary transistor, coupled to the output terminal of the second input transistor, wherein a current of the output terminal of the second input transistor flows into the second input transistor and the second auxiliary transistor;
    a second active inductor, coupled to the output terminal of the second input transistor; and
    wherein the current flowing through another portion of the input current replica circuit is equal to the current flowing through the second input transistor, and both a current of the second active inductor and the current of the other portion of the input current replica circuit flow into the output terminal of the second input transistor.

* * * * *